US011011233B2

(12) United States Patent
Kim et al.

(10) Patent No.: US 11,011,233 B2
(45) Date of Patent: May 18, 2021

(54) NONVOLATILE MEMORY DEVICE, STORAGE DEVICE INCLUDING NONVOLATILE MEMORY DEVICE, AND METHOD OF ACCESSING NONVOLATILE MEMORY DEVICE

(71) Applicant: SAMSUNG ELECTRONICS CO., LTD., Suwon-si (KR)

(72) Inventors: Dae-Jin Kim, Hwaseong-si (KR); Sang-Ryong Park, Hwaseong-si (KR); Jong-Nam Baek, Hwaseong-si (KR); Sejeong Jang, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/442,670

(22) Filed: Jun. 17, 2019

(65) Prior Publication Data
US 2020/0143885 A1 May 7, 2020

(30) Foreign Application Priority Data
Nov. 7, 2018 (KR) .................. 10-2018-0135621

(51) Int. Cl.
*G11C 16/04* (2006.01)
*G11C 16/08* (2006.01)
(Continued)

(52) U.S. Cl.
CPC .............. *G11C 16/08* (2013.01); *G06F 3/064* (2013.01); *G06F 3/0614* (2013.01);
(Continued)

(58) Field of Classification Search
CPC ..... G11C 16/08; G11C 16/16; G11C 16/3445; G06F 3/0614; G06F 3/064; G06F 12/0673; G06F 12/0246
(Continued)

(56) References Cited

U.S. PATENT DOCUMENTS 7,818,493 B2   10/2010  Traister et al.
8,635,399 B2   1/2014   Lee et al.
(Continued)

FOREIGN PATENT DOCUMENTS

KR   10-2016-0055310 A   5/2016

OTHER PUBLICATIONS

Search Report dated Apr. 9, 2020, issued by the European Patent Office in counterpart European Patent Application 19195249.8.

*Primary Examiner* — Huan Hoang
(74) *Attorney, Agent, or Firm* — Sughrue Mion, PLLC

(57) ABSTRACT

A nonvolatile memory device includes a memory cell array that includes memory blocks, wherein each of the memory blocks includes pages each including memory cells, a row decoder circuit that selects one of the pages from a selected memory block of the memory blocks in a write operation and selects memory cells of a close unit from the selected memory block in a close operation, and a page buffer circuit that writes data into memory cells of a page selected by the row decoder circuit in the write operation and writes dummy data into the memory cells of the close unit selected by the row decoder circuit in the close operation. The close unit includes one or more pages, and, in the close operation, the row decoder circuit adjusts a size of the close unit.

20 Claims, 14 Drawing Sheets

(51) Int. Cl.
  *G06F 3/06* (2006.01)
  *G06F 12/02* (2006.01)
  *G11C 16/16* (2006.01)
  *G11C 16/34* (2006.01)

(52) U.S. Cl.
  CPC ........ *G06F 3/0673* (2013.01); *G06F 12/0246* (2013.01); *G11C 16/16* (2013.01); *G11C 16/3445* (2013.01)

(58) Field of Classification Search
  USPC .................................................. 365/185.11
  See application file for complete search history.

(56) References Cited

U.S. PATENT DOCUMENTS

| | | | |
|---|---|---|---|
| 9,229,806 B2 | 1/2016 | Mekhanik et al. | |
| 9,281,064 B2 | 3/2016 | Maccarrone et al. | |
| 9,466,386 B2 | 10/2016 | Park et al. | |
| 9,520,901 B2 | 12/2016 | Suzuki et al. | |
| 9,613,708 B1 | 4/2017 | Hsieh et al. | |
| 9,640,281 B1 | 5/2017 | Seo et al. | |
| 10,048,863 B1 | 8/2018 | Goss et al. | |
| 2012/0159058 A1 | 6/2012 | Yonezawa et al. | |
| 2014/0112055 A1* | 4/2014 | Kawahara | G11C 13/00 365/148 |
| 2015/0095558 A1 | 4/2015 | Kim et al. | |
| 2015/0103599 A1 | 4/2015 | Kim et al. | |
| 2015/0135039 A1 | 5/2015 | Mekhanik et al. | |
| 2015/0332770 A1 | 11/2015 | Kim | |
| 2016/0027504 A1 | 1/2016 | Lee | |
| 2016/0133329 A1 | 5/2016 | Moon et al. | |
| 2017/0255403 A1 | 9/2017 | Sharon et al. | |
| 2017/0278574 A1 | 9/2017 | Park et al. | |
| 2018/0129473 A1 | 5/2018 | Ahmed | |
| 2018/0129474 A1 | 5/2018 | Ahmed | |

* cited by examiner

NONVOLATILE MEMORY DEVICE, STORAGE DEVICE INCLUDING NONVOLATILE MEMORY DEVICE, AND METHOD OF ACCESSING NONVOLATILE MEMORY DEVICE

CROSS-REFERENCE TO RELATED APPLICATIONS

This application claims priority under 35 U.S.C. § 119 from Korean Patent Application No. 10-2018-0135621 filed on Nov. 7, 2018, in the Korean Intellectual Property Office, the disclosure of which is incorporated by reference herein in its entirety.

BACKGROUND

1. Field

Embodiments relate to a semiconductor memory, and more particularly, relate to a nonvolatile memory device adaptively closing an opened memory block, a storage device including the nonvolatile memory device, and a method of accessing the nonvolatile memory device.

2. Description of the Related Art

A nonvolatile memory device is configured to retain previously stored data even though a power is turned off. The nonvolatile memory device includes, a flash memory device, a phase change memory device, a ferroelectric memory device, a magnetic memory device, a resistive memory device, etc.

As the degree of integration of the flash memory device is improved, a space between memory cells may become narrower. This causes an increase in influence of coupling between memory cells. Accordingly, a device or a method for preventing data of memory cells from being disturbed by the coupling is required.

SUMMARY

It is an aspect to provide a nonvolatile memory device which prevents data from being disturbed due to coupling and has improved reliability, a storage device including the nonvolatile memory device, and a method of accessing the nonvolatile memory device.

According to an aspect of an exemplary embodiment, there is provided a nonvolatile memory device includes a memory cell array that includes memory blocks, wherein each of the memory blocks includes pages each including memory cells, a row decoder circuit that selects one of the pages from a selected memory block of the memory blocks in a write operation and selects memory cells of a close unit from the selected memory block in a close operation, and a page buffer circuit that writes data into memory cells of a page selected by the row decoder circuit in the write operation and writes dummy data into the memory cells of the close unit selected by the row decoder circuit in the close operation. The close unit includes one or more pages. In the close operation, the row decoder circuit adjusts a size of the close unit.

According to another aspect of an exemplary embodiment, there is provided a storage device includes a nonvolatile memory device that includes memory blocks, wherein each of the memory blocks includes pages each including memory cells, and a controller that transmits an address of a selected memory block to be selected from the memory blocks and a close command to the nonvolatile memory device. The nonvolatile memory device performs a close operation in which dummy data are written in memory cells, into which data are not previously written, from among memory cells of the selected memory block in a close unit, in response to the close command. The close unit is adjusted in the close operation.

According to yet another aspect of an exemplary embodiment, there is provided a method of performing a closing operation on a nonvolatile memory device which includes memory blocks, each of the memory blocks including memory cells, includes writing dummy data into memory cells of a first size among first memory cells, into which data are not previously written, from among the memory cells of a memory block selected from the memory blocks, and writing the dummy data into memory cells of a second size among the first memory cells. The second size is different from the first size.

BRIEF DESCRIPTION OF THE FIGURES

The above and other aspects will become apparent by describing in detail exemplary embodiments thereof with reference to the accompanying drawings, in which.

DETAILED DESCRIPTION

Memory cells of the flash memory device are implemented with memory cell transistors each including a control gate and a floating gate. Threshold voltages of the memory cells are changed by accumulating or trapping charges at the floating gates of the memory cells or discharging charges from the floating gates. Data may be written at the memory cells by adjusting the threshold voltages of the memory cells.

The threshold voltages of the memory cells may have an influence of coupling. For example, in the case where a voltage is changed in the vicinity of a particular memory cell or a voltage difference between the particular memory cell and a neighboring area is maintained, an electric field may be applied to the particular memory cell. The electric field applied to the particular memory cell may have an influence on a threshold voltage of the particular memory cell.

As described above, as the degree of integration of the flash memory device is improved, a space between memory cells may become narrower. This causes an increase in influence of coupling between memory cells. Embodiments provide a nonvolatile memory device which prevents data from being disturbed due to coupling and has improved reliability.

Below, embodiments will be described in detail and clearly to such an extent that an ordinary one in the art may easily implement the embodiments.

Figure 1:
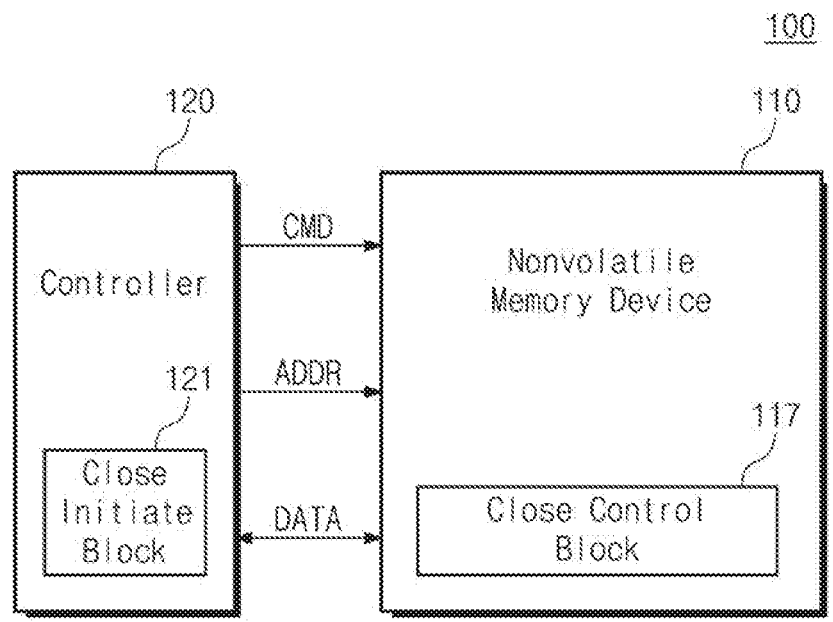
FIG. 1 is a block diagram illustrating a storage device according to an embodiment.

FIG. 1 is a block diagram illustrating a storage device 100 according to an embodiment. Referring to FIG. 1, the storage device 100 includes a nonvolatile memory device 110 and a controller 120.

The nonvolatile memory device 110 may receive a command CMD and an address ADDR from the controller 120. The command CMD may include a write command, a read command, an erase command, a close command, etc. The address ADDR may indicate memory cells where a write operation or a read operation is to be performed or may indicate a memory block where an erase operation or a close operation is to be performed.

The nonvolatile memory device 110 may exchange data "DATA" with the controller 120. For example, when the command CMD corresponding to a write command is received from the controller 120, the nonvolatile memory device 110 may receive the data "DATA" for the write operation from the controller 120.

When the command CMD corresponding to a read command is received from the controller 120, the nonvolatile memory device 110 may transmit the data "DATA" read through the read operation. When the command CMD corresponding to an erase command is received from the controller 120, the nonvolatile memory device 110 may perform the erase operation without exchanging the data "DATA".

The nonvolatile memory device 110 includes memory blocks, each of which has memory cells. When the nonvolatile memory device 110 writes data into a particular memory block, the particular memory block may be opened to write the data. This may be referred to as an "opened memory block".

In the case in which data are stored in all memory cells of a particular memory block, the nonvolatile memory device 110 may not write data into the particular memory cell anymore. In this case, the particular memory cell may be closed for writing. This may be referred to as a "closed memory block".

The nonvolatile memory device 110 may include a close control block 117. When the command CMD corresponding to the close command is received, the close control block 117 may control a close operation associated with a memory block which the address ADDR indicates. The close operation may be performed to change an opened memory block to a closed memory block by writing dummy data into memory cells, in which data are not stored, of the opened memory block.

The controller 120 may transmit the command CMD and the address ADDR to the nonvolatile memory device 110 and may exchange the data "DATA" with the nonvolatile memory device 110. The controller 120 may control operations of the nonvolatile memory device 110 in response to a request of an external host device or an internal schedule.

The controller 120 may include a close initiate block 121. The close initiate block 121 may determine whether the close operation is to be performed. In response to determining that the close operation is to be performed, the close initiate block 121 may transmit a command CMD corresponding to the close command to the nonvolatile memory device 110 together with the address ADDR. For example, in response to a time of a threshold or more passing after a particular memory block is opened, or in response to a sudden power-off (SPO) occurring, the close initiate block 121 may request the close operation from the nonvolatile memory device 110.

Regardless of the number of memory cells, in which data are not stored, of a memory block selected by the address ADDR, the close initiate block 121 may transmit the close command only once with regard to the memory block. Upon receiving the close command, the close control block 117 of the nonvolatile memory device 110 may close the selected memory block by writing dummy data into all memory cells, in which data are not stored, of the selected memory block.

In particular, the nonvolatile memory device 110 according to an embodiment may adaptively perform the close operation. For example, the close control block 117 of the nonvolatile memory device 110 may adjust the number (e.g., a size of a group) of memory cells into which dummy data are to be written at a time. By adaptively performing the close operation, the nonvolatile memory device 110 may prevent previously stored data from being disturbed, and may prevent potential disturbance which may occur at memory cells into which dummy data are written.

Figure 2:
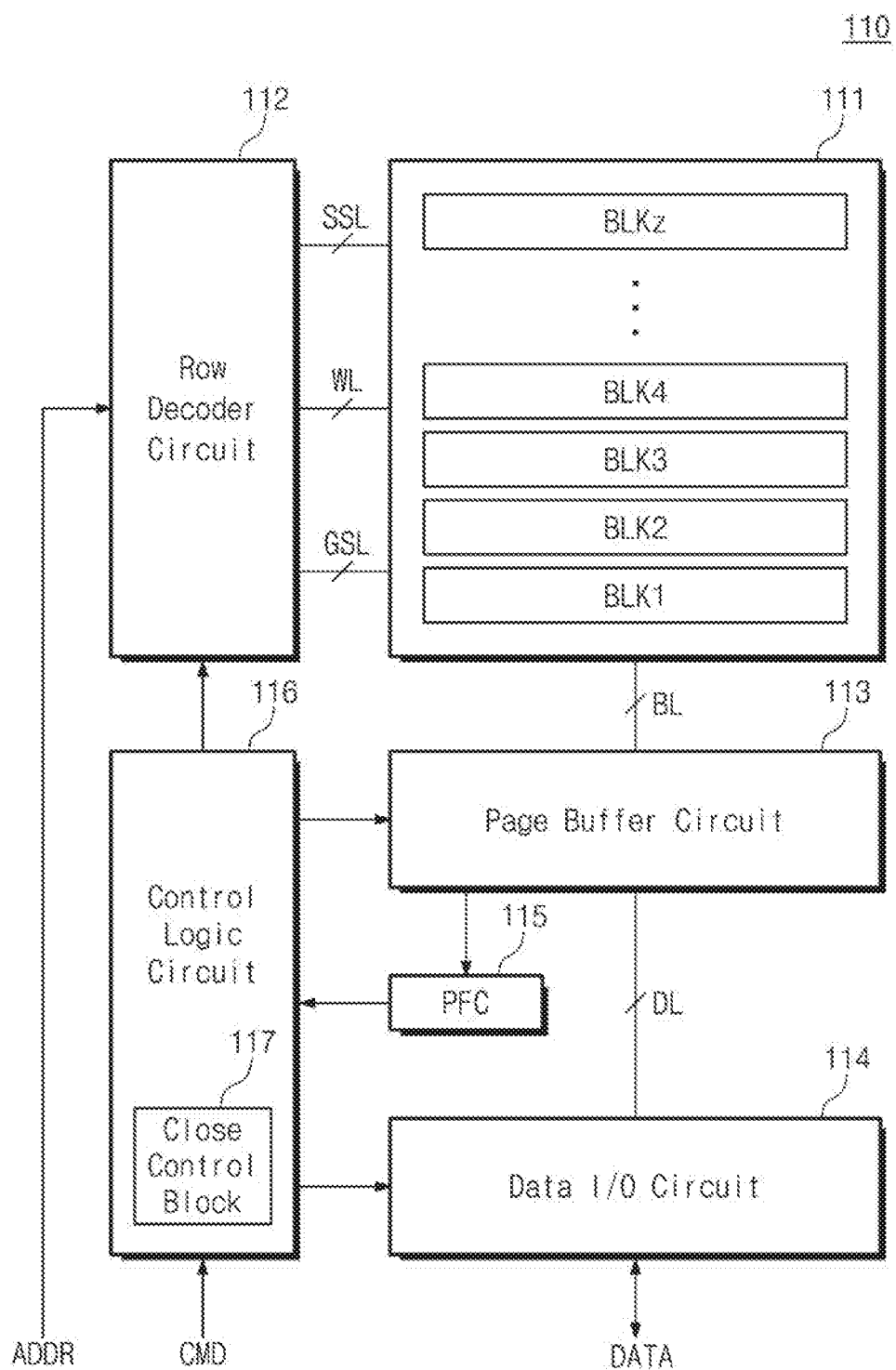
FIG. 2 is a block diagram illustrating a nonvolatile memory device according to an embodiment.

FIG. 2 is a block diagram illustrating the nonvolatile memory device 110 according to an embodiment. Referring to FIGS. 1 and 2, the nonvolatile memory device 110 includes a memory cell array 111, a row decoder circuit 112, a page buffer circuit 113, a data input/output (I/O) circuit 114, a pass-fail check circuit (PFC) 115, and a control logic circuit 116.

The memory cell array 111 includes a plurality of memory blocks BLK1 to BLKz. Each of the memory blocks BLK1 to BLKz may include a plurality of memory cells. Each of the memory blocks BLK1 to BLKz may be connected to the row decoder circuit 112 through ground selection lines GSL, word lines WL, and string selection lines SSL.

Each of the memory blocks BLK1 to BLKz may be connected to the page buffer circuit 113 through a plurality of bit lines BL. The plurality of memory blocks BLK1 to BLKz may be connected in common to the plurality of bit lines BL. The memory cells of the plurality of memory blocks BLK1 to BLKz may have the same structure.

In some embodiments, each of the memory blocks BLK1 to BLKz may correspond to a unit of an erase operation. The memory cells of the memory cell array 111 may be erased for each memory block. The memory cells belonging to one memory block may be erased at the same time. In other embodiments, each memory block may be divided into a plurality of sub-blocks. Each of the plurality of sub-blocks may be a unit of the erase operation.

The row decoder circuit 112 is connected to the memory cell array 111 through the plurality of ground selection lines GSL, the plurality of word lines WL, and the plurality of string selection lines SSL. The row decoder circuit 112 operates under control of the control logic circuit 116.

The row decoder circuit 112 may decode an address received from the controller 120 and may control voltages to be applied to the string selection lines SSL, the word lines WL, and the ground selection lines GSL based on the decoded address.

The page buffer circuit 113 is connected to the memory cell array 111 through the plurality of bit lines BL. The page buffer circuit 113 is connected with the data input/output circuit 114 through a plurality of data lines DL. The page buffer circuit 113 operates under control of the control logic circuit 116.

In a write operation, the page buffer circuit 113 may store data to be written into memory cells. The page buffer circuit 113 may apply voltages to the plurality of bit lines BL based on the stored data. In the read operation or a verification read operation associated with the write operation or the erase operation, the page buffer circuit 113 may sense voltages of the bit lines BL and may store a result of the sensing.

The data input/output circuit 114 is connected with the page buffer circuit 113 through the plurality of data lines DL. The data input/output circuit 114 may output data read by the page buffer circuit 113 to the controller 120 through an input/output channel and may transmit data received from the controller 120 through the input/output channel to the page buffer circuit 113.

After the verification read operation associated with the write operation or the erase operation, the pass-fail check circuit 115 may receive the sensing result from the page buffer circuit 113. The pass-fail check circuit 115 may count the number of on-cells or off-cells based on the received sensing result.

Here, an "on-cell" may indicate a memory cell which has a threshold voltage lower than a verification read voltage and is turned on in the verification read operation. An "off-cell" may indicate a memory cell which has a threshold voltage not lower than the verification read voltage and is turned off in the verification read operation. The pass-fail check circuit 115 may provide a result of the counting to the control logic circuit 116.

The control logic circuit 116 may receive the command CMD from the controller 120. The control logic circuit 116 may decode the received command and may control the nonvolatile memory device 110 depending on the decoded command. The control logic circuit 116 may receive the counting result of the pass-fail check circuit 115. The control logic circuit 116 may determine a pass or a fail of the write operation or the erase operation depending on the counting result.

The control logic circuit 116 may include the close control block 117. The close control block 117 may control the row decoder circuit 112 and the page buffer circuit 113 so as to divide memory cells into a close unit in the close operation and sequentially write dummy data. The close control block 117 may adaptively adjust the close unit in the close operation.

Figure 3:
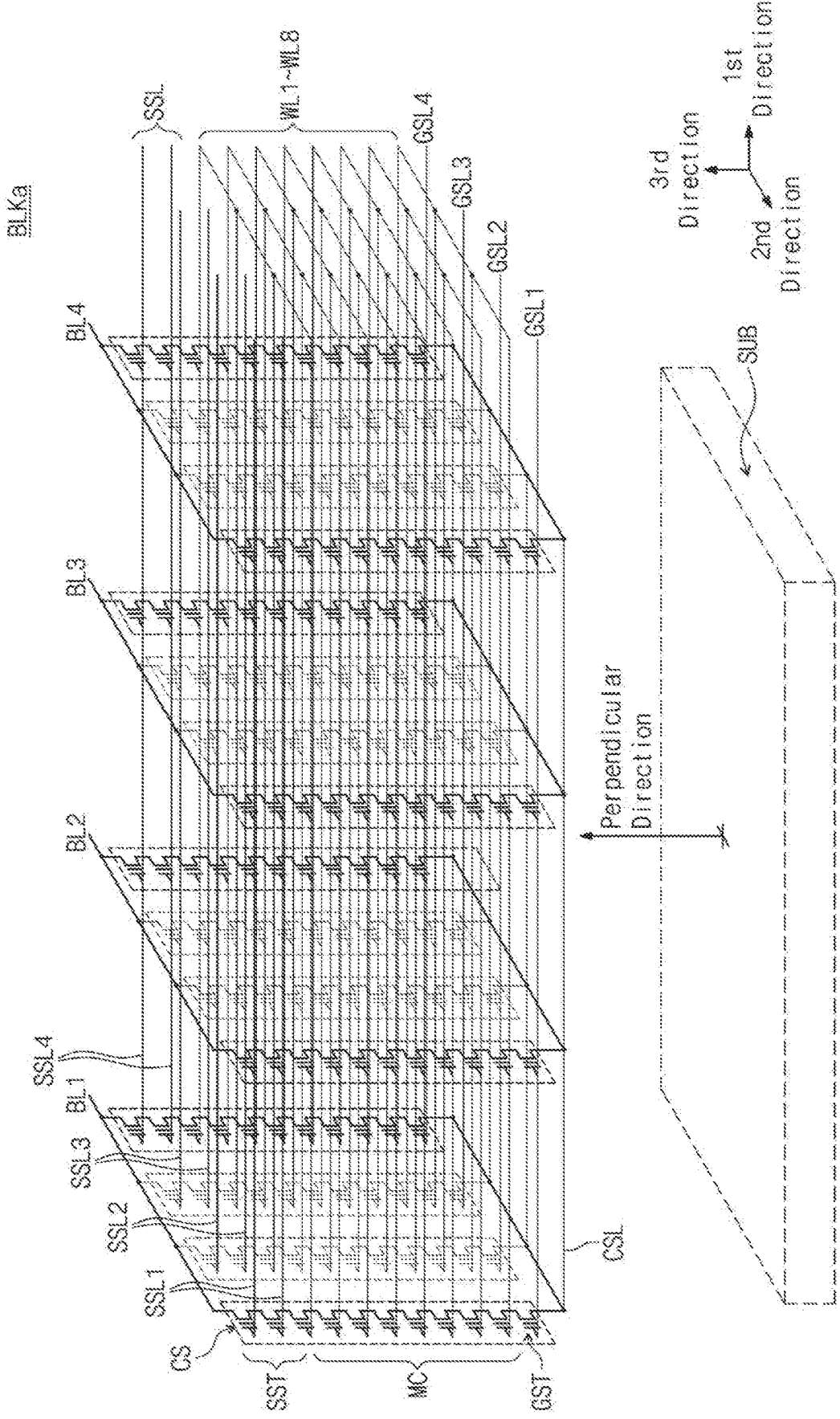
FIG. 3 is a circuit diagram illustrating an example of one memory block of memory blocks of the nonvolatile memory device of FIG. 2.

FIG. 3 is a circuit diagram illustrating an example of one memory block BLKa of the memory blocks BLK1 to BLKz of the nonvolatile memory device 110 of FIG. 2. Referring to FIG. 3, a plurality of cell strings CS may be arranged on a substrate SUB in rows and columns. The plurality of cell strings CS may be connected in common to a common source line CSL formed on (or in) the substrate SUB. In FIG. 3, a location of the substrate SUB is exemplified to help understand a structure of the memory block BLKa.

An example is illustrated in FIG. 3 in which the common source line CSL is connected to lower ends of the cell strings CS. However, it is sufficient that the common source line CSL is electrically connected to the lower ends of the cell strings CS, and the inventive concept is not limited to the case that the common source line CSL is physically located at the lower ends of the cell strings CS. An example is illustrated in FIG. 3 in which the cell strings CS are arranged in a four-by-four matrix. However, the number of cell strings CS in the memory block BLKa may be more or less than that illustrated in FIG. 3.

Each of first to fourth string selection lines SSL1 to SSL4 may extend in a first direction. Each of first to fourth bit lines BL1 and BL4 may extend in a second direction. Memory cells MC1 to MC8 may be stacked in a third direction. The first to fourth string selection lines SSL1 to SSL4 may form the rows, and the first to fourth bit lines BL1 to BL4 may form the columns.

Cell strings CS of each row may be connected in common to a ground selection line GSL and to corresponding string selection lines of the first to fourth string selection lines SSL1 to SSL4. Cell strings CS of each column may be connected to a corresponding bit line of the first to fourth bit lines BL1 to BL4. For ease of illustration, the cell strings CS connected to the second and third string selection lines SSL2 and SSL3 are depicted to be blurry.

Each cell string CS may include at least one ground selection transistor GST connected to the ground selection line GSL, a plurality of memory cells MC1 to MC8 respectively connected to a plurality of word lines WL1 to WL8, and string selection transistors SST respectively connected to the string selection lines SSL1, SSL2, SSL3, or SSL4.

In each cell string CS, the ground selection transistor GST, the memory cells MC1 to MC8, and the string selection transistors SST may be serially connected to each other along a direction perpendicular to the substrate SUB and may be sequentially stacked along the direction perpendicular to the substrate SUB. In each cell string CS, one or more of the memory cells MC1 to MC8 may be used as a dummy memory cell(s). The dummy memory cell(s) may not be programmed (e.g., may be program-inhibited) or may be programmed to be different from the memory cells MC1 to MC8.

In some embodiments, memory cells which are located at the same height and are associated with one of the string selection lines SSL1, SSL2, SSL3, or SSL4 may form one page. Memory cells of one page may be connected to one sub-word line. Sub-word lines of pages located at the same height may be connected in common to one word line.

In some embodiments, sub-word lines of pages located at the same height may be connected to each other at a height at which the sub-word lines are formed. In other embodiments, sub-word lines of pages located at the same height may be indirectly connected to each other in any other layer, which has a height different from a height at which the sub-word lines are formed, such as a metal layer.

Figure 4:
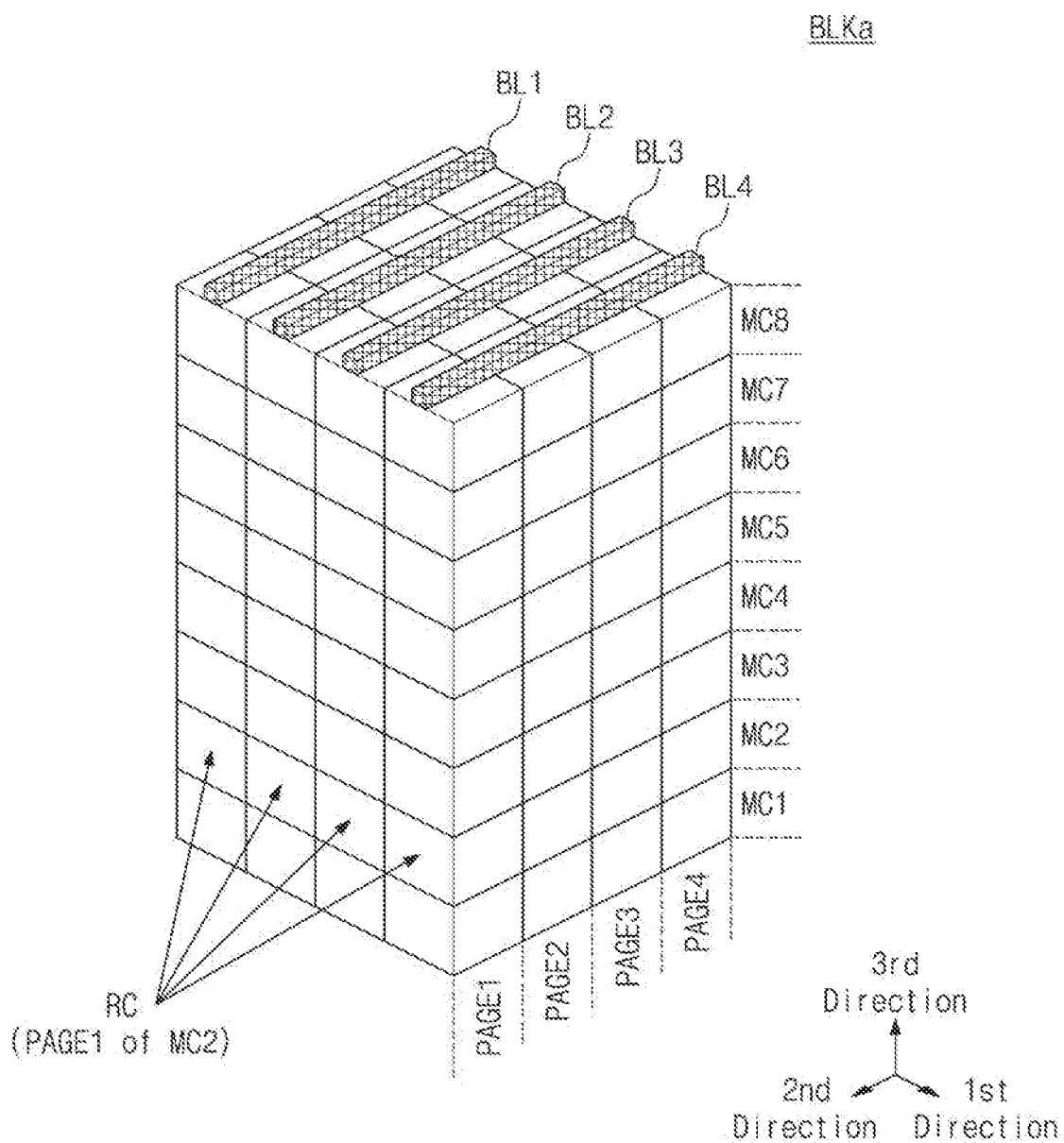
FIG. 4 schematically illustrates first to eighth memory cells of the memory block of FIG. 3.

FIG. 4 schematically illustrates the first to eighth memory cells MC1 to MC8 of the memory block of FIG. 3. For easy comparison with FIG. 3, the first to fourth bit lines BL1 to BL4 and the first to third directions are illustrated in FIG. 4.

In FIG. 4, the first to eighth memory cells MC1 to MC8 are depicted with a hexahedron, and selection transistors, selection lines, and word lines are omitted for ease of description. Referring to FIGS. 3 and 4, a first page PAGE1 is illustrated at a lower end of memory cells corresponding to the first string selection line SSL1. Likewise, second to fourth pages PAGE2 to PAGE4 are illustrated at lower ends of memory cells corresponding to the second to fourth string selection lines SSL2 to SSL4.

In FIG. 4, memory cells marked with reference cells RC may correspond to the first page PAGE1 of the second memory cells MC2. The first to eighth memory cells MC1 to MC8 may be called like the reference cells RC. The reference cells RC are marked merely to describe an example of a designation, and do not have any other meaning or do not intend any other characteristic. That is, any cells may be marked as reference cells.

Figure 5:
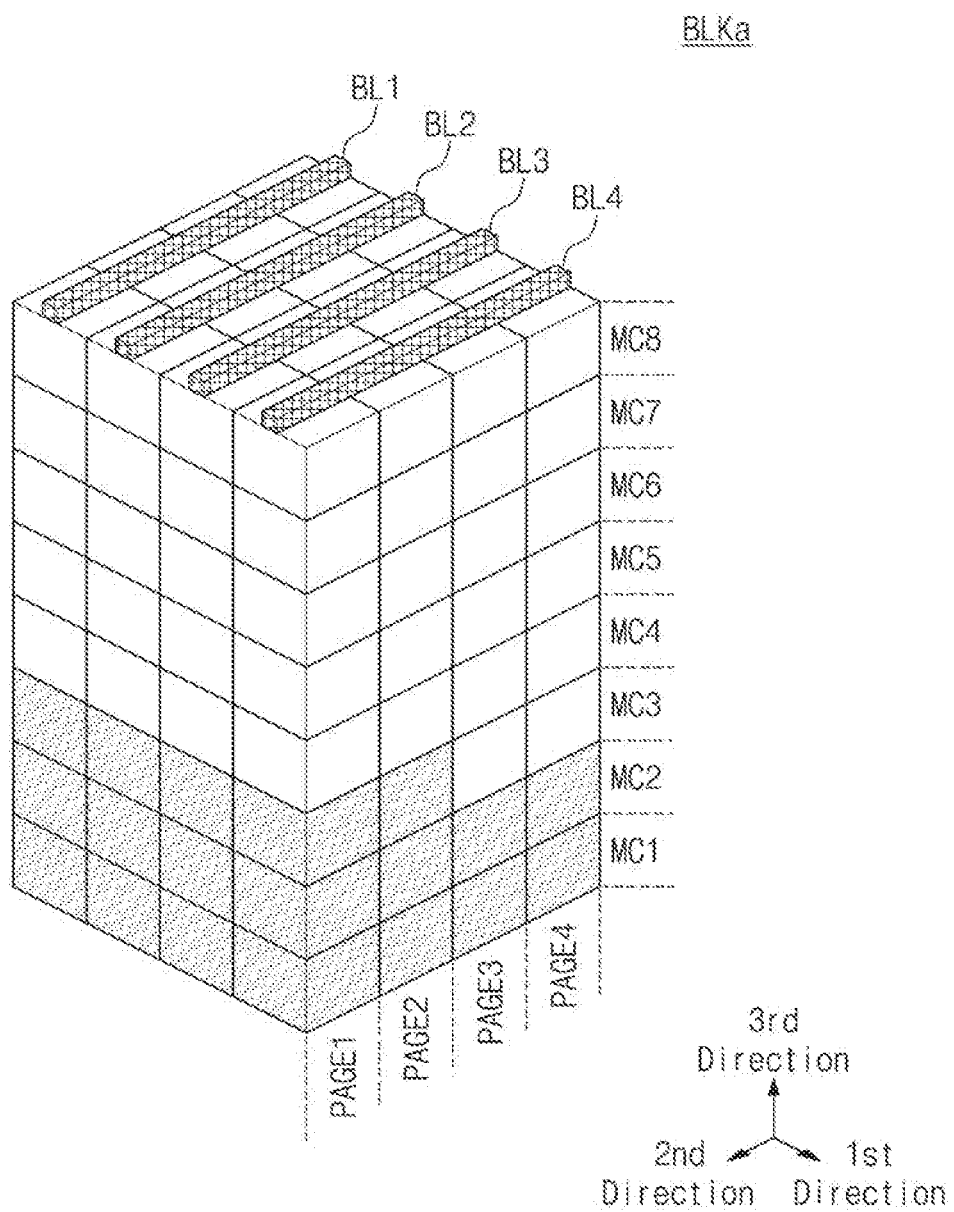
FIG. 5 illustrates an example in which data are written into some memory cells of first to eighth memory cells of a memory block.

When the nonvolatile memory device 110 starts to write data into the memory block BLKa, the memory block BLKa may be opened. FIG. 5 illustrates an example in which data are written into some memory cells of the first to eighth memory cells MC1 to MC8 of the memory block BLKa.

Referring to FIGS. 1 and 5, memory cells into which data are written are depicted with a dot-filled box. For example, data may be written into the first and second memory cells MC1 and MC2. Data may be written into the third memory cells MC3 of the first page PAGE1 and the second page PAGE2.

The memory cells into which data are written have relatively high threshold voltages. The memory cells into which data are not written have relatively low threshold voltages. In a state in which data are written as illustrated in FIG. 5, differences of threshold voltages may cause coupling between the memory cells into which data are written and the memory cells into which data are not written. In the case in which a state in which the memory cells into which data are written and the memory cells into which data are not written are mixed is left alone for a long time, the coupling may cause data disturbance.

Also, in the case in which the memory cells into which data are not written are left alone for a long time, the disturbance may occur at the memory cells, and thus, data written later into the memory cells may also have an influence of the disturbance. Accordingly, in response to the memory block BLKa being left alone in an opened state not less than a threshold time, or in response to a time at which the memory block BLKa is left alone due to the sudden power-off (SPO) being not predicted, the close initiate block 121 of the controller 120 may direct the close operation with regard to the memory block BLKa.

The nonvolatile memory device 110 may adaptively perform the close operation on the memory block BLKa. The nonvolatile memory device 110 may divide memory cells of the memory block BLKa, into which data are not written, into a close unit, to sequentially write dummy data. The nonvolatile memory device 110 may adaptively adjust the close unit.

Figure 6:
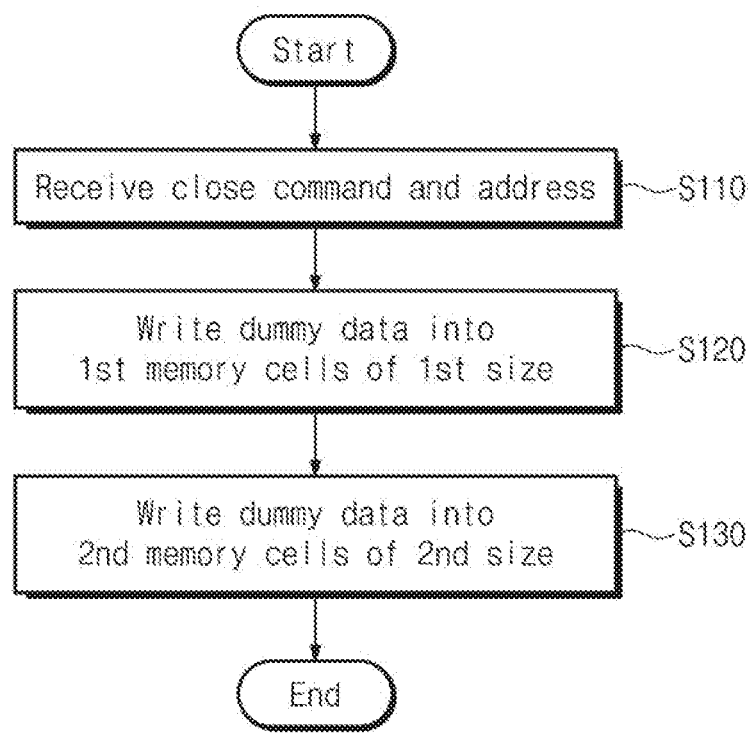
FIG. 6 is a flowchart illustrating an operating method of a nonvolatile memory device according to an embodiment.

FIG. 6 is a flowchart illustrating an operating method of the nonvolatile memory device 110 according to an embodiment. Referring to FIGS. 1, 2, and 6, in operation S110, the nonvolatile memory device 110 may receive the close command and an address. Depending on the close command and the address, the nonvolatile memory device 110 may perform the close operation through operation S120 and operation S130.

In operation S120, the nonvolatile memory device 110 may write dummy data into first memory cells of a first size. For example, the nonvolatile memory device 110 may select first memory cells of a first size from memory cells, into which data are not written, of a memory block corresponding to the address. The first size may be a first count. The nonvolatile memory device 110 may simultaneously write dummy data into the first memory cells.

In operation S130, the nonvolatile memory device 110 may write dummy data into second memory cells of a second size. For example, the nonvolatile memory device 110 may select second memory cells of a second size from the memory cells, into which data are not written, of the memory block corresponding to the address. The second size may be a second count, and may be different from the first size. The nonvolatile memory device 110 may simultaneously write dummy data into the second memory cells.

As described with reference to FIG. 6, the nonvolatile memory device 110 may adjust the close unit to the first size and may write dummy data, and the nonvolatile memory device 110 may adjust the close unit to the second size different from the first size and may write dummy data.

Figure 7:
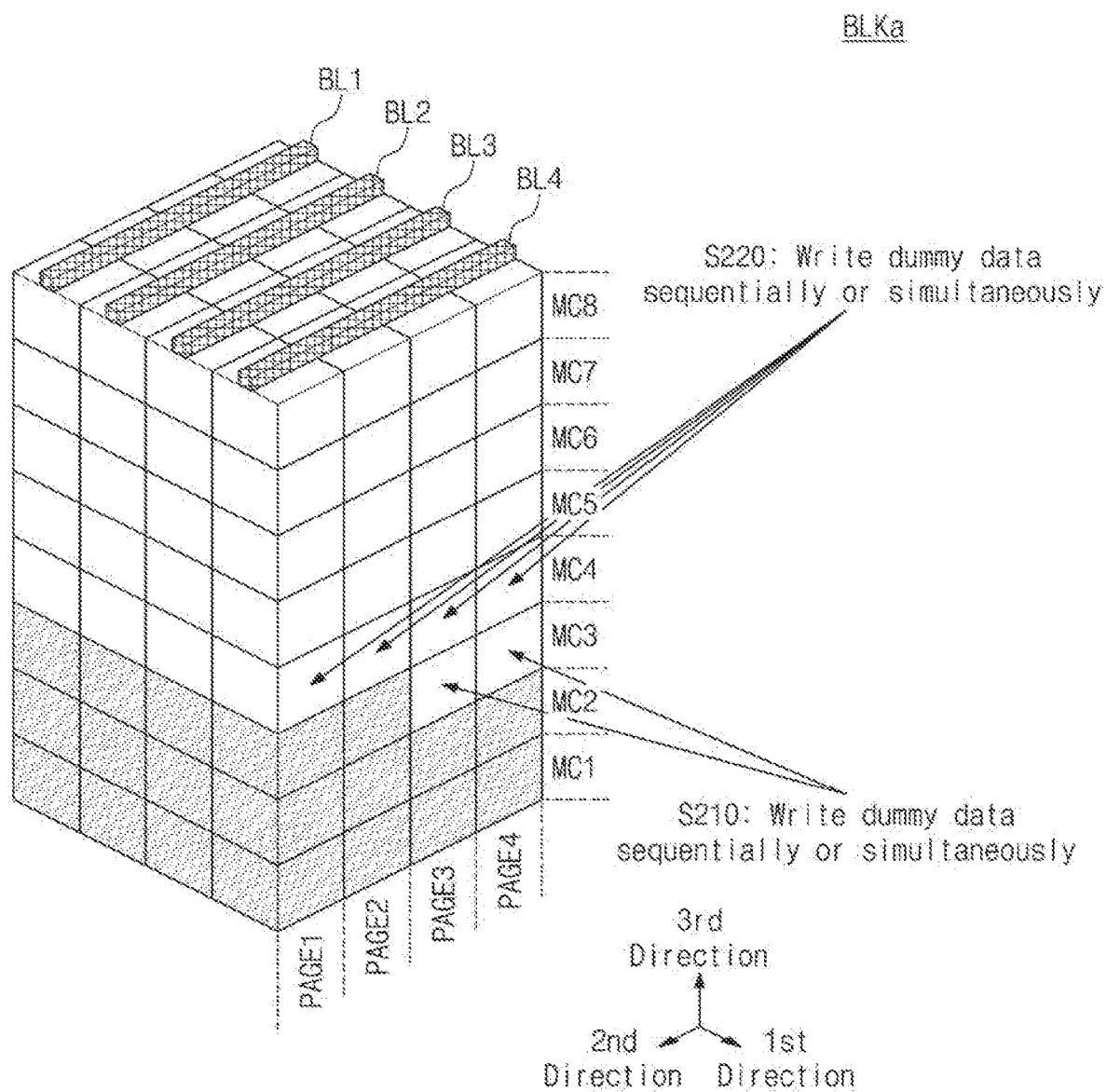
FIG. 7 illustrates an example in which a nonvolatile memory device performs a close operation on a memory block of FIG. 5.

FIG. 7 illustrates an example in which the nonvolatile memory device 110 performs a close operation on the memory block BLKa of FIG. 5. Referring to FIGS. 1, 2, and 7, in operation S210, the nonvolatile memory device 110 may write dummy data into the third memory cells MC3 of the third page PAGE3 and the fourth page PAGE4 and may close the third page PAGE3 and the fourth page PAGE4 of the third memory cells MC3.

The nonvolatile memory device 110 may write dummy data into the third memory cells MC3 of the third page PAGE3 and the third memory cells MC3 of the fourth page PAGE4 sequentially or simultaneously. That is, with regard to the third memory cells MC3, the close unit may correspond to one page or two pages.

The third memory cells MC3 of the third page PAGE3 and the fourth page PAGE4 are adjacent to memory cells into which data are previously written. As used in this description "memory cells into which data are previously written" denotes memory cells containing data previously stored in the memory block, as distinguished from dummy data. When dummy data are written into the third memory cells MC3 of the third page PAGE3 and the fourth page PAGE4, the third memory cells MC3 of the first and second pages PAGE1 and PAGE2, into which data are previously stored, and the second memory cells MC2 may have an influence of the coupling.

To prevent existing data from being disturbed due to the coupling, the nonvolatile memory device 110 may adjust the close unit to be relatively small upon writing dummy data into memory cells adjacent to the memory cells into which data are written. The close unit may be relatively small compared to, for example, another close unit adjusted upon writing dummy data into memory cells not adjacent to the memory cells into which data are previously written.

In operation S220, the nonvolatile memory device 110 may write dummy data into the fourth memory cells MC4 and may close the fourth memory cells MC4. The nonvolatile memory device 110 may write dummy data into the fourth memory cells MC4 of the first to fourth pages PAGE1 to PAGE4 sequentially or simultaneously. That is, with regard to the fourth memory cells MC4, the close unit may correspond to one page or four pages (or one word line).

As described above, a portion of the fourth memory cells MC4 are adjacent to memory cells into which data are previously written. Upon closing the fourth memory cells MC4, the third memory cells MC3 of the first and second pages PAGE1 and PAGE2, into which data are previously stored, may have an influence of the coupling. To prevent the influence of the coupling, the nonvolatile memory device 110 may adjust the close unit to be relatively small upon writing dummy data into memory cells adjacent to memory cells into which data are written. The close unit may be relatively small compared to, for example, another close unit adjusted upon writing dummy data into memory cells not adjacent to the memory cells into which data are previously written.

Figure 8:
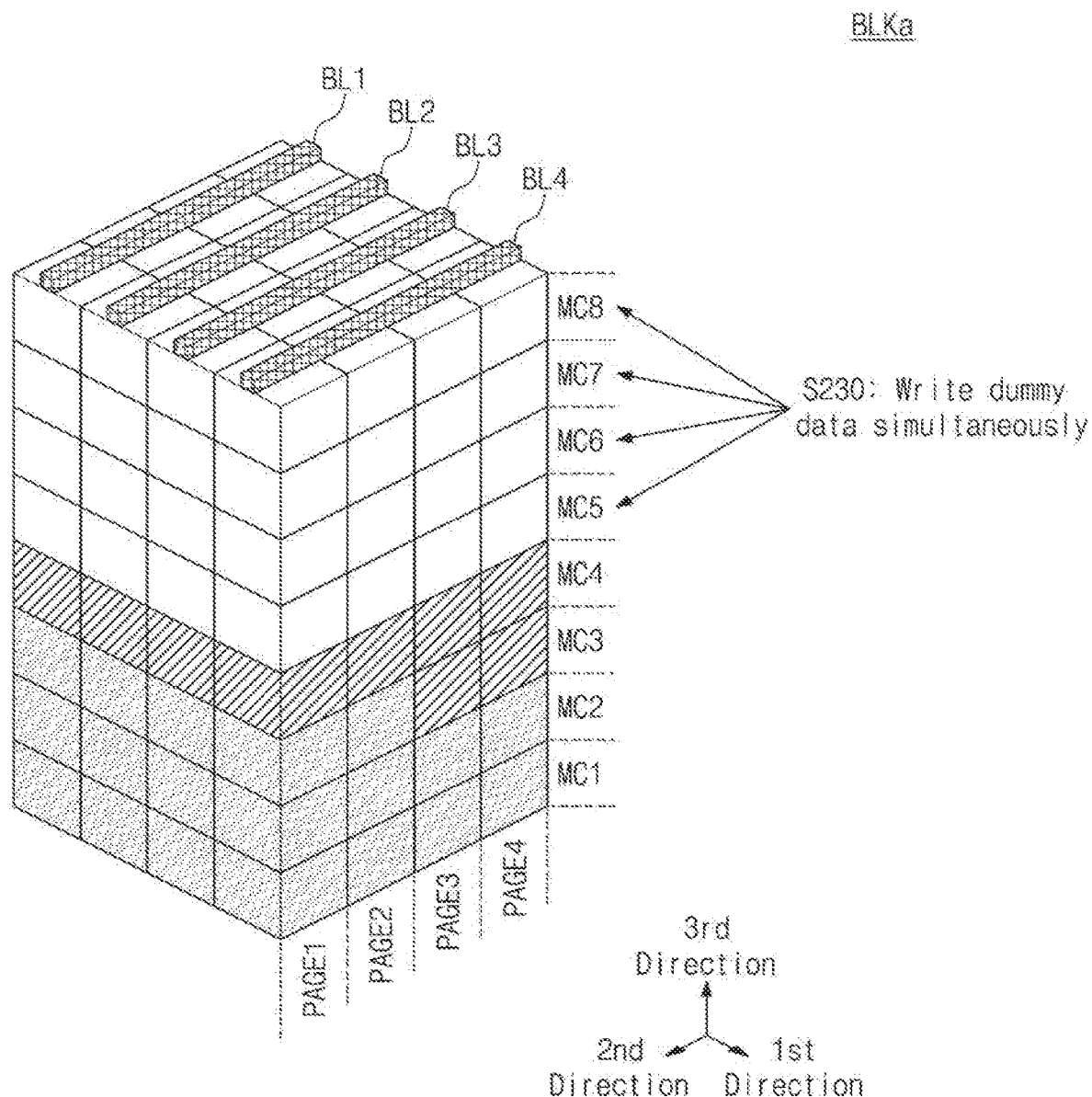
FIG. 8 illustrates an example in which a nonvolatile memory device continues a close operation with regard to a memory block, as a continuation from FIG. 7.

FIG. 8 illustrates an example in which the nonvolatile memory device 110 continues a close operation with regard to the memory block BLKa, as a continuation from FIG. 7, (i.e., after the operations of FIG. 7 have been performed). In other words, FIG. 8 shows a situation in which dummy data have been previously written to the third memory cells MC3 of the third page PAGE3 and the fourth page PAGE4 and the fourth memory cells MC4. Referring to FIGS. 1, 2, and 8, memory cells into which dummy data are written are depicted with a slashed box.

In operation S230, the nonvolatile memory device 110 may write dummy data into the fifth to eighth memory cells MC5 to MC8 and may close the fifth to eighth memory cells MC5 to MC8. The fifth to eighth memory cells MC5 to MC8 are not adjacent to memory cells into which data are previously written. Accordingly, the coupling occurring upon closing the fifth to eighth memory cells MC5 to MC8 may not have an influence on previously written data (or may not cause data disturbance).

Accordingly, the nonvolatile memory device 110 may simultaneously write dummy data into the fifth to eighth memory cells MC5 to MC8. For example, in the nonvolatile memory device 110, a program voltage may be simultaneously applied to the fifth to eighth word lines WL5 to WL8. A time of the close operation may be shortened by closing the fifth to eighth memory cells MC5 to MC8 at the same time.

As described above, the nonvolatile memory device 110 according to an embodiment may set the close unit to a relatively small size upon closing memory cells adjacent to memory cells into which data are previously written. Accordingly, previously written data are prevented from being disturbed, and the reliability of the storage device 100 is improved.

Also, the nonvolatile memory device 110 according to an embodiment may set the close unit to a relatively large size upon closing memory cells not adjacent to memory cells into which data are previously written. Accordingly, a time for the close operation is decreased.

In some embodiments, the nonvolatile memory device 110 may have an upper limit of the close unit. In some embodiments, the upper limit of the close unit may be defined by a number of word lines. For example, the upper limit of the close unit may be set to a value corresponding to 4, 8, or 16 word lines. Upon writing dummy data into memory cells not adjacent to memory cells into which data are previously written, the nonvolatile memory device 110 may divide the relevant memory cells by the upper limit of the close unit so as to be sequentially closed.

In some embodiments, the close operation described with reference to FIGS. 7 and 8 may be performed in response to one close command. The nonvolatile memory device 110 may overall close memory cells, into which data are not written, of a selected memory block in response to one close command. Accordingly, a time to transmit a command and an address between the controller 120 and the nonvolatile memory device 110 is reduced, and a time for the close operation is shortened.

Figure 9:
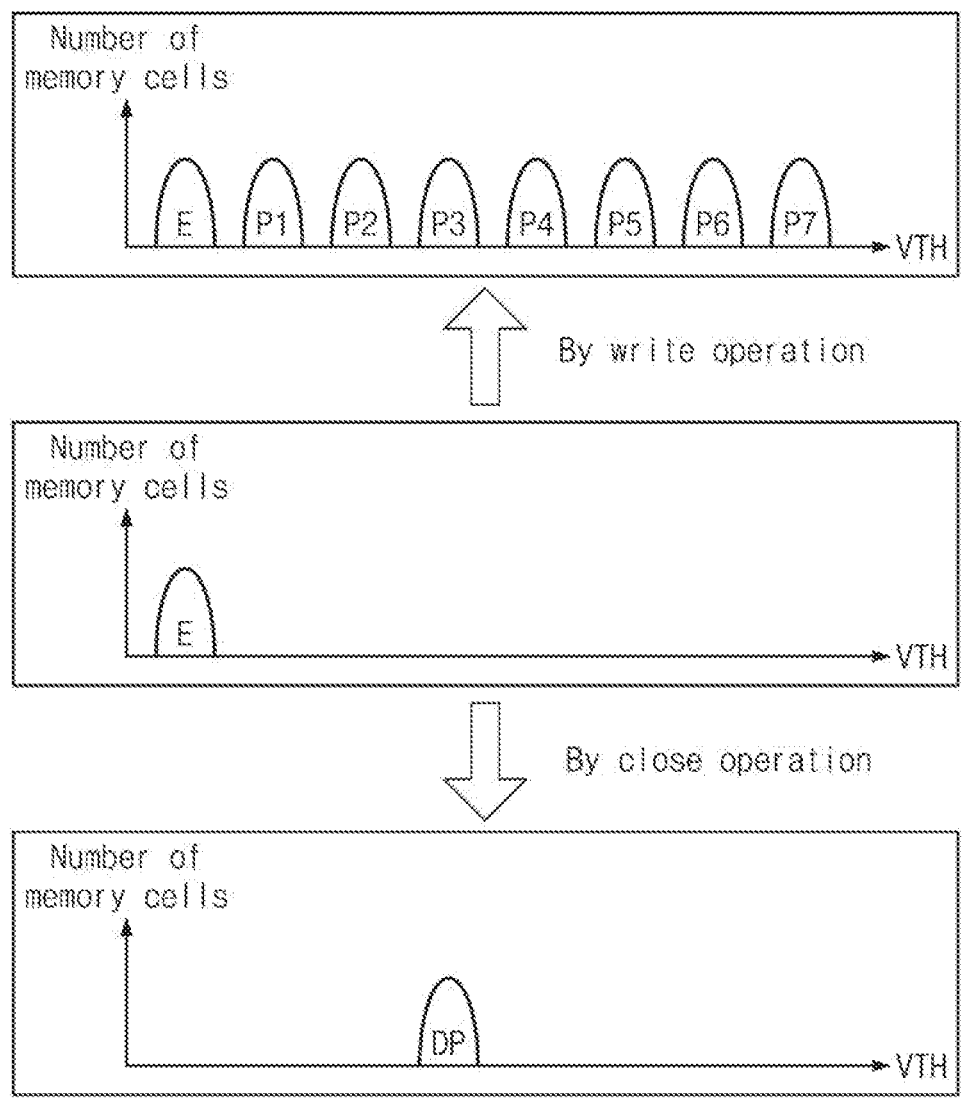
FIG. 9 illustrates examples in which threshold voltages of memory cells are changed by a write operation and a close operation, according to an embodiment.

FIG. 9 illustrates examples in which threshold voltages of memory cells are changed by a write operation and a close operation, according to an embodiment. In FIG. 9, a horizontal axis represents threshold voltages VTH of memory cells, and a vertical axis represents the number of memory cells.

Referring to FIGS. 1, 2, and 9, memory cells into which data are not written may have threshold voltages of an erase state "E" as illustrated on the center of FIG. 9. In the case where a write operation is performed, memory cells may have threshold voltages corresponding to data. For example, when 3-bit data are written per memory cell, memory cells may have threshold voltages of the erase state "E" and first to seventh program states P1 to P7.

For example, in the write operation, a nonvolatile memory device may apply a program voltage to a word line to make threshold voltages of memory cells high. The nonvolatile memory device may determine whether threshold voltages of memory cells reach a target state corresponding to the data among the first to seventh program states P1 to P7, by using verification read voltages respectively corresponding to the first to seventh program states P1 to P7.

Memory cells reaching a target state may be program-inhibited such that threshold voltages are not increased. Memory cells which do not reach a target state may be continuously programmed such that threshold voltages are increased.

It is necessary to distinguish from the erase state "E" of memory cells into which data are written and the erase state "E" of memory cells into which data are not written. The memory cells into which data are written may store data through a combination of the erase state "E" and the first to seventh program states P1 to P7. Accordingly, the erase state "E" of memory cells into which data are written may be considered as a portion of data, and may not be targeted for the close operation.

In the case where the close operation is performed, memory cells may have threshold voltages corresponding to a dummy program state DP. The dummy program state DP may be higher than a threshold voltage of the erase state "E" and may be lower than a threshold voltage of the seventh program state P7.

In some embodiments, when the close operation is performed, a verification read operation using a verification read voltage may be omitted. The nonvolatile memory device 110 may allow threshold voltages of memory cells to form a distribution similar to the dummy program state DP by repeatedly applying a program voltage to a word line (or word lines).

Figure 10:
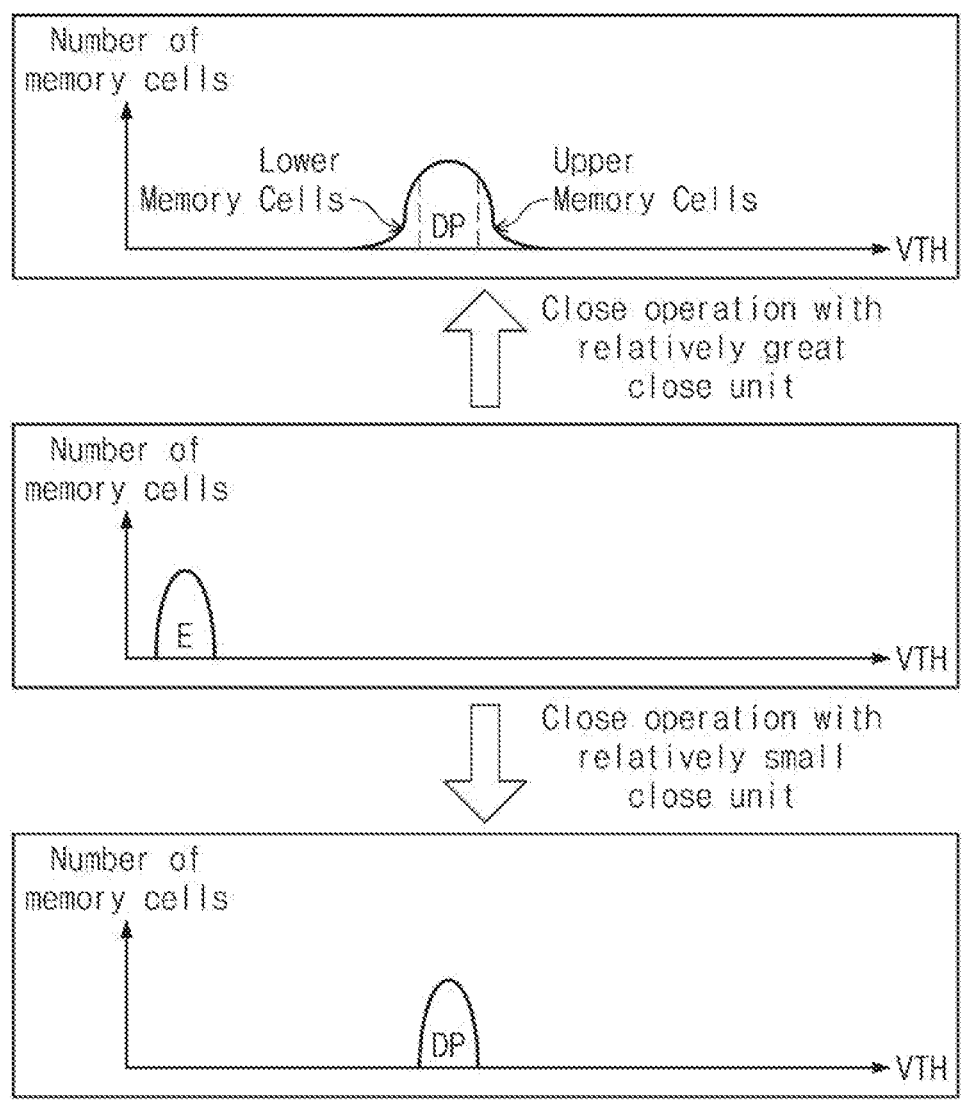
FIG. 10 illustrates an example of potential disturbance capable of occurring depending on a size of a close unit.

FIG. 10 illustrates an example of potential disturbance capable of occurring depending on a size of a close unit. Referring to FIGS. 1, 2, and 10, an erase state of memory cells into which data are not written may be changed to the dummy program state DP through the close operation.

When the close unit is relatively small, threshold voltages of memory cells may form a distribution similar to the dummy program state DP. When the close unit is relatively great, threshold voltages of memory cells may be distributed widely with respect to the dummy program state DP.

In the case where the close unit is relatively great, lower memory cells, the threshold voltages of which are lower than the dummy program state DP, and upper memory cells, the threshold voltages of which are higher than the dummy program state DP, may occur.

When an erase operation is performed on memory cells, the lower memory cells may be deep-erased. The deep-erased memory cells may cause a write error when data are written into the deep-erased memory cells later. When an erase operation is performed on memory cells, the upper memory cells may cause an erase error.

To prevent the above issues, the nonvolatile memory device 110 according to an embodiment may write dummy data while adaptively detecting an appropriate close unit upon closing memory cells not adjacent to memory cells into which data are previously written.

Figure 11:
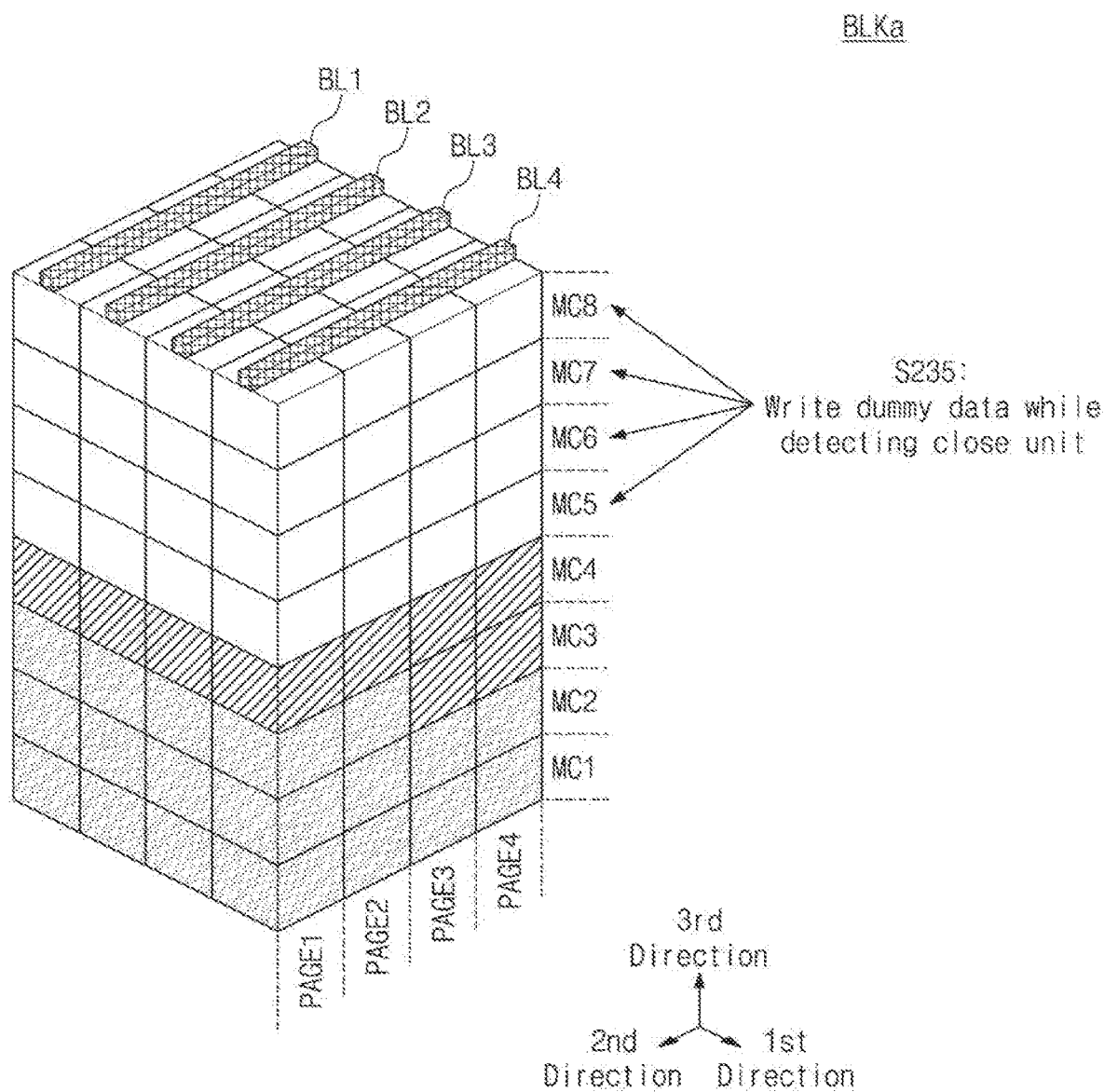
FIG. 11 illustrates an example of performing a close operation while detecting a close unit, followed by FIG. 7.

FIG. 11 illustrates an example of performing a close operation while detecting a close unit, as a continuation from FIG. 7. Referring to FIGS. 1, 2, and 11, in operation S235, the nonvolatile memory device 110 may detect an appropriate close unit while adjusting a close unit, upon writing dummy data into the fifth to eighth memory cells MC5 to MC8.

Figure 12:
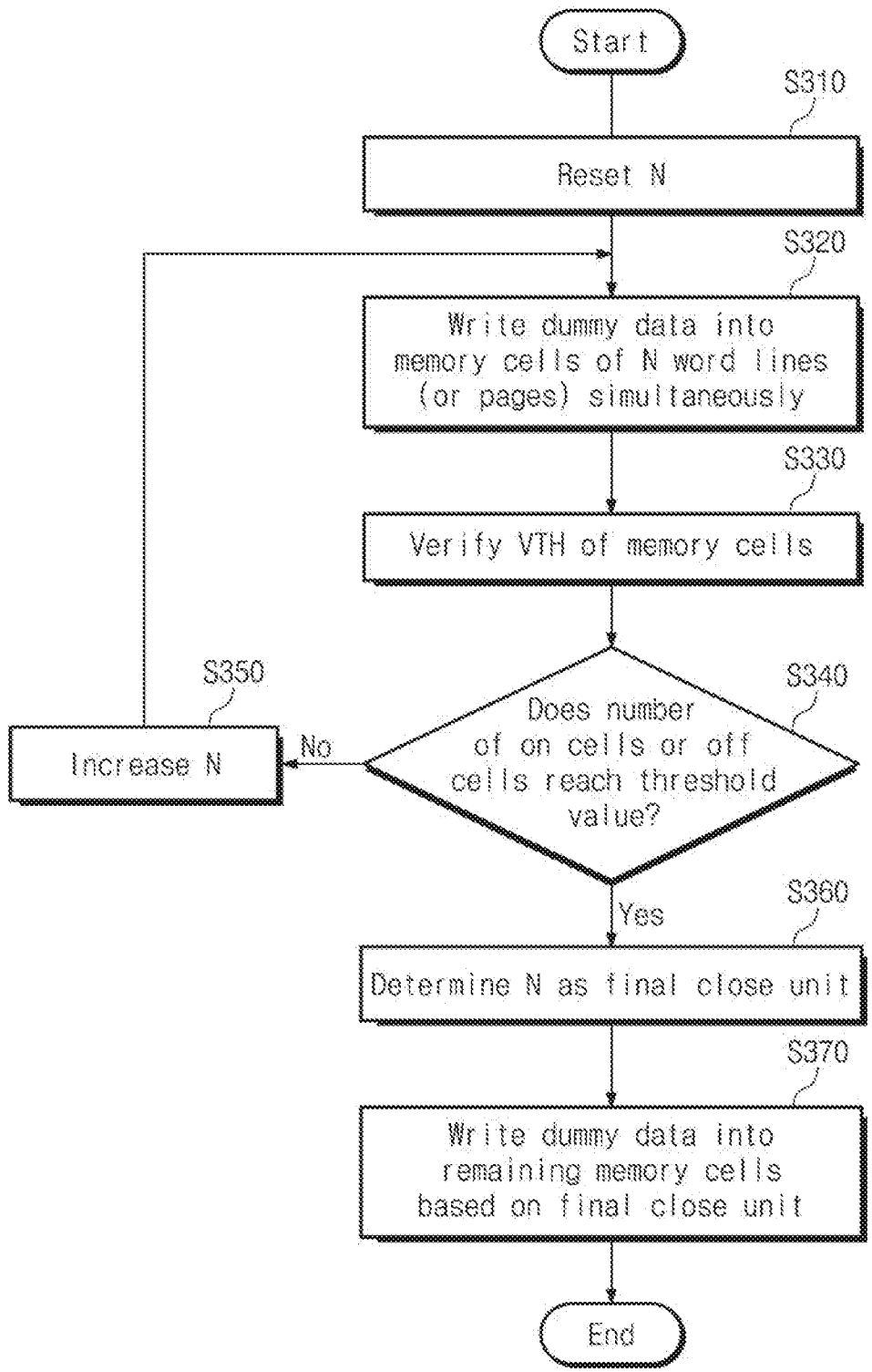
FIG. 12 is a flowchart illustrating an example of a method in which a nonvolatile memory device detects a close unit, according to an embodiment.

FIG. 12 is a flowchart illustrating an example of a method in which the nonvolatile memory device 110 detects a close unit, according to an embodiment. Referring to FIGS. 1, 2, 11, and 12, in operation S310, the nonvolatile memory device 110 may reset a close unit "N". For example, the close unit "N" may be reset to one word line or the given number of word lines (or pages).

In operation S320, the nonvolatile memory device 110 may simultaneously write dummy data into memory cells of a word line(s) (or a page(s)) corresponding to the close unit "N". For example, the nonvolatile memory device 110 may close memory cells of the close unit "N" by repeatedly applying a program voltage to a word line (or word lines) corresponding to the close unit "N".

After the memory cells are closed, in operation S330, the nonvolatile memory device 110 may verify threshold voltages VTH of the closed memory cells. For example, as described with reference to FIG. 10, the nonvolatile memory device 110 may perform a verification read operation for verifying whether lower memory cells or upper memory cells are present in at least a part of the closed memory cells.

For example, the lower memory cells may be detected by counting the number of on-cells. The upper memory cells may be detected by counting the number of off-cells. The pass-fail check circuit 115 may provide the number of on-cells or off-cells to the control logic circuit 116.

In operation S340, the nonvolatile memory device 110 may determine whether the number of on-cells or off-cells reaches a threshold value. That is, the nonvolatile memory device 110 may determine whether the number of on-cells or the number of off-cells is greater than or equal to the threshold value. In some embodiments, the threshold value may be set experimentally. In some embodiments, the threshold value may be previously set. The case where the number of on-cells does not reach the threshold value may be determined as lower memory cells do not exist or the number of lower memory cells is sufficiently small. The case where the number of off-cells does not reach the threshold value may be determined as upper memory cells do not exist or the number of upper memory cells is sufficiently small.

When the number of on-cells and the number of off-cells do not reach the threshold value (operation S340, No), in operation S350, the nonvolatile memory device 110 may increase the close unit "N". For example, the nonvolatile memory device 110 may increase the close unit "N" twice (i.e., double the close unit "N") or may increase the close unit "N" as much as a preset increment. Afterwards, the nonvolatile memory device 110 may close any other memory cells from operation S320.

The case where the number of on-cells reaches the threshold value may be determined as the number of lower memory cells reaches the limit capable of enduring. The case where the number of off-cells reaches the threshold value may be determined as the number of upper memory cells reaches the limit capable of enduring. When the number of on-cells or the number of off-cells reaches the threshold value (operation S340, Yes), in operation S360, the nonvolatile memory device 110 may determine the current close unit "N" as an appropriate final close unit.

In operation S370, the nonvolatile memory device 110 may write dummy data into remaining memory cells which are not yet closed, based on the final close unit. For example, the nonvolatile memory device 110 may divide the remaining memory cells by the final close unit so as to be closed sequentially.

In some embodiments, the nonvolatile memory device 110 may internally store the final close unit. The nonvolatile memory device 110 may detect final close units respectively corresponding to the memory blocks BLK1 to BLKz and may internally store the detected final close units. That is, each of the memory blocks BLK1 to BLKz may have a corresponding final close unit. Each memory block BLK1 to BLKz may have a different final close unit, which may be the same as or different from the final close unit of one or more other memory blocks BLK1 to BLKz. In the case where a final close unit of a particular memory block is stored, the nonvolatile memory device 110 may load and use the final close unit of the particular memory block. An operation of again detecting a final close unit may be omitted. In some embodiments, detecting the close unit may be performed periodically.

For another example, the nonvolatile memory device 110 may transmit a final close unit to the controller 120. The controller 120 may store a final close unit of each of the memory blocks BLK1 to BLKz as management information of the nonvolatile memory device 110. The controller 120 may back up the final close units of the memory blocks BLK1 to BLKz to the nonvolatile memory device 110 together with any other management information.

When the controller 120 requests a close operation of a particular memory block, the controller 120 may determine whether a final close unit of the particular memory block is stored as management information. In the case where the final close unit of the particular memory block is stored as management information, the controller 120 may transmit the final close unit to the nonvolatile memory device 110 together with the close command. The nonvolatile memory device 110 may perform the close operation by using the final close unit transmitted from the controller 120.

In the case where the final close unit of the particular memory block is not stored as management information, the controller 120 may transmit the close command to the nonvolatile memory device 110 without the final close unit. The nonvolatile memory device 110 may detect a final close unit of the particular memory block and may perform the close operation by using the detected final close unit. The nonvolatile memory device 110 may transmit the detected final close unit to the controller 120.

Figure 13:
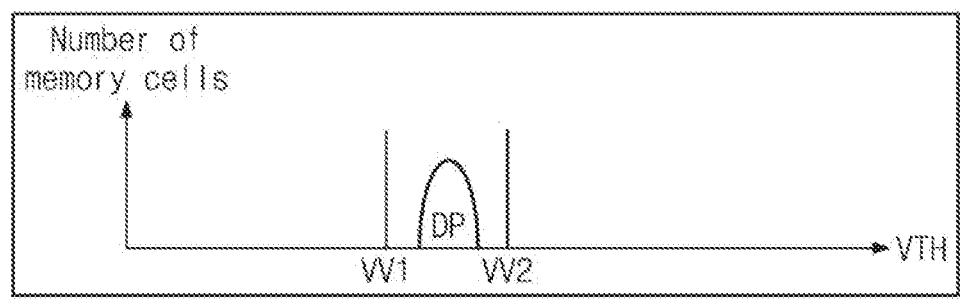
FIG. 13 illustrates an example in which a nonvolatile memory device verifies lower memory cells and upper memory cells, according to an embodiment.

FIG. 13 illustrates an example in which a nonvolatile memory device verifies lower memory cells and upper memory cells, according to an embodiment. Referring to FIGS. 1, 2, and 13, the nonvolatile memory device 110 may verify lower memory cells by using a first verification voltage VV1 lower than a lower limit of the dummy program state DP. The nonvolatile memory device 110 may count on-cells, which are turned on upon applying the first verification voltage VV1 to a word line, as lower memory cells.

Also, the nonvolatile memory device 110 may verify upper memory cells by using a second verification voltage VV2 higher than an upper limit of the dummy program state DP. The nonvolatile memory device 110 may count off-cells, which are turned off upon applying the second verification voltage VV2 to the word line, as upper memory cells.

Figure 14:
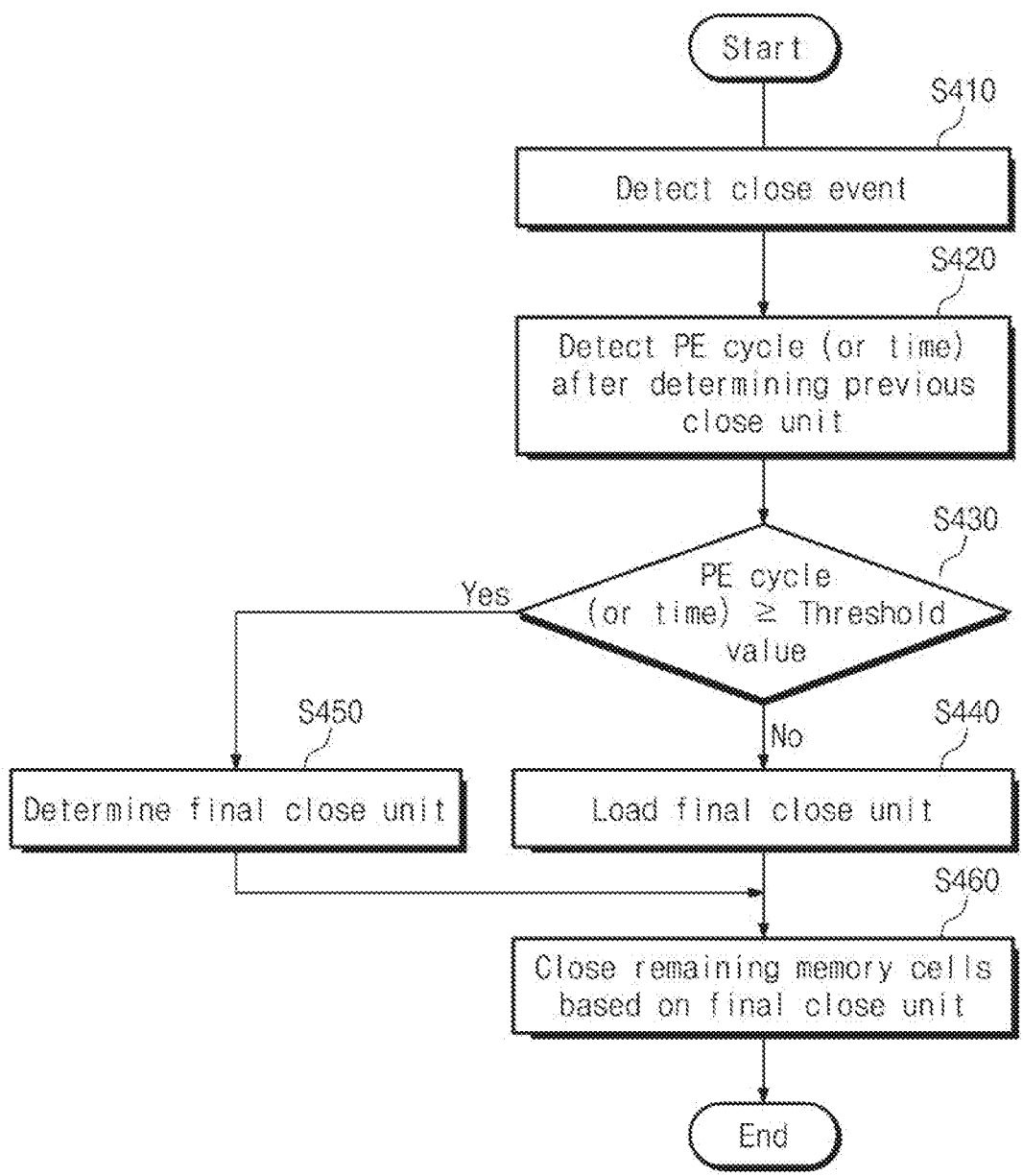
FIG. 14 illustrates an example in which a nonvolatile memory device or a controller updates a final close unit, according to an embodiment.

FIG. 14 illustrates an example in which the nonvolatile memory device 110 or the controller 120 updates a final close unit, according to an embodiment. Referring to FIGS. 1, 2, and 14, in operation S410, a close event may be detected. For example, the nonvolatile memory device 110 may receive the close command from the controller 120. For another example, the controller 120 may detect to close a particular memory block.

In operation S420, the nonvolatile memory device 110 or the controller 120 may detect a program and erase cycle (PE cycle) (or a time) progressing after determining a final close unit of a memory block to be closed.

In operation S430, the nonvolatile memory device 110 or the controller 120 may determine whether the program and erase cycle (or the time) is greater than or equal to a threshold value. When the program and erase cycle (or the time) is smaller than the threshold value (operation S430, No), operation S440 is performed. In operation S440, the nonvolatile memory device 110 or the controller 120 may load a final close unit of the memory block to be closed.

For example, the nonvolatile memory device 110 may load the final close unit stored therein. For another example, the controller 120 may transmit the final close unit to the nonvolatile memory device 110 together with the close command. The nonvolatile memory device 110 may load the final close unit transmitted from the controller 120 onto the control logic circuit 116. Afterwards, operation S460 is performed.

When the program and erase cycle (or the time) is greater than or equal to the threshold value (operation S430, Yes), operation S450 is performed. In operation S450, the nonvolatile memory device 110 or the controller 120 may determine the final close unit.

For example, the controller 120 may determine the final close unit as described with reference to FIG. 12. For another example, the controller 120 may transmit the close command to the nonvolatile memory device 110 without the final close unit. In this situation, the nonvolatile memory device 110 may determine the final close unit as described with reference to FIG. 12. Afterwards, operation S460 is performed.

In operation S460, the nonvolatile memory device 110 may close the remaining memory cells based on the final close unit.

As described above, the storage device 100 according to various embodiments is configured to write dummy data into first memory cells, which are adjacent to memory cells into which data are previously written, by a relatively small unit and to write dummy data into second memory cells, which are not adjacent to the memory cells into which data are previously written, by a relatively great unit. Accordingly, a time for a close operation is shortened, and the reliability of data is improved.

Also, the storage device 100 according to various embodiments may detect a close unit for preventing disturbance from occurring at the second memory cells. Accordingly, a time for the close operation is shortened, and the reliability of data is improved.

Also, the storage device 100 according to various embodiments may close a selected memory block by transmitting the close command once. Accordingly, a time for the close operation is further shortened.

As described above, components of the storage device 100 are described by using the terms "first", "second", "third", and the like. However, the terms "first", "second",
"third", and the like may be used to distinguish components from each other and do not limit the inventive concept. For example, the terms "first", "second", "third", and the like do not involve an order or a numerical meaning of any form.

In the above embodiments, components according to embodiments are described by using blocks. The blocks may be implemented with various hardware devices, such as an integrated circuit, an application specific IC (ASCI), a field programmable gate array (FPGA), and a complex programmable logic device (CPLD), firmware driven in hardware devices, software such as an application, or a combination of a hardware device and software. Also, the blocks may include circuits or intellectual property (IP) implemented with semiconductor elements in an integrated circuit.

According to the embodiments described above, since memory cells of an opened memory block are adaptively closed, previously stored data are prevented from being disturbed, and memory cells to be closed are prevented from experiencing potential disturbance. Accordingly, a nonvolatile memory device with improved reliability, a storage device including the nonvolatile memory device, and a method of accessing the nonvolatile memory device are provided.

While the inventive concept has been described with reference to exemplary embodiments thereof, it will be apparent to those of ordinary skill in the art that various changes and modifications may be made thereto without departing from the spirit and scope of the inventive concept as set forth in the following claims.

What is claimed is:

1. A nonvolatile memory device comprising:
   a memory cell array including memory blocks, wherein each of the memory blocks includes pages each including memory cells;
   a row decoder circuit configured to select one of the pages from a selected memory block of the memory blocks in a write operation and to select memory cells of a close unit from the selected memory block in a close operation; and
   a page buffer circuit configured to write data into memory cells of a page selected by the row decoder circuit in the write operation and to write dummy data into the memory cells of the close unit selected by the row decoder circuit in the close operation,
   wherein the close unit includes one or more pages, and
   wherein, during the close operation, the row decoder circuit is further configured to adjust a size of the close unit according to a location of the selected memory cells within the selected memory block.

2. The nonvolatile memory device of claim 1, wherein, in the close operation, the row decoder circuit and the page buffer circuit sequentially select memory cells, into which data are not previously written, from among the memory cells of the selected memory block in the close unit such that the dummy data are sequentially written into the memory cells selected in the close unit.

3. The nonvolatile memory device of claim 1, wherein the row decoder circuit is connected to the memory cells of the selected memory block through word lines,
   wherein each of the word lines is connected to memory cells arranged in two or more rows, and
   wherein the rows correspond to the pages, respectively.

4. The nonvolatile memory device of claim 3, wherein, in the close operation, in a state in which data are previously written into memory cells of at least one page connected to a particular word line of the word lines, the row decoder circuit and the page buffer circuit are further configured to set the close unit to a page with regard to remaining memory cells connected to the particular word line and to write the dummy data to the remaining memory cells.

5. The nonvolatile memory device of claim 3, wherein, in the close operation, in a state in which data are previously written into memory cells of at least one page connected to a particular word line of the word lines, the row decoder circuit and the page buffer circuit are further configured to set remaining memory cells connected to the particular word line to the close unit and to write the dummy data to the remaining memory cells.

6. The nonvolatile memory device of claim 3, wherein, in the close operation, in a state in which data are not previously written into memory cells connected to a particular word line of the word lines and data are previously written into adjacent memory cells connected to a word line adjacent to the particular word line, the row decoder circuit and the page buffer circuit are further configured to set the close unit to a page with regard to the memory cells connected to the particular word line and to write the dummy data to the memory cells connected to the particular word line.

7. The nonvolatile memory device of claim 3, wherein, in the close operation, in a state in which data are not previously written into memory cells connected to a particular word line of the word lines and data are previously written into adjacent memory cells connected to a word line adjacent to the particular word line, the row decoder circuit and the page buffer circuit are further configured to set the memory cells connected to the particular word line to the close unit and to write the dummy data to the memory cells connected to the particular word line.

8. The nonvolatile memory device of claim 3, wherein, in the close operation, the row decoder circuit and the page buffer circuit are further configured to set first memory cells connected to first word lines of the word lines to the close unit and to write the dummy data into the first memory cells at the same time,
    wherein at least one word line is interposed between the first word lines and a second word line, and
    wherein at least a part of second memory cells connected to the second word line stores the data.

9. The nonvolatile memory device of claim 3, wherein, in the close operation, the row decoder circuit and the page buffer circuit divide first memory cells connected to first word lines of the word lines in the close unit, to sequentially write the dummy data,
    wherein at least one word line is interposed between the first word lines and a second word line,
    wherein at least a part of second memory cells connected to the second word line stores the data, and
    wherein the close unit includes two or more word lines.

10. The nonvolatile memory device of claim 3, wherein, in the close operation, the row decoder circuit and the page buffer circuit divide first memory cells connected to first word lines of the word lines in the close unit, to sequentially write the dummy data,
    wherein at least one word line is interposed between the first word lines and a second word line,
    wherein at least a part of second memory cells connected to the second word line stores the data, and
    wherein the close unit increases by a unit of at least one word line until a final close unit is determined.

11. The nonvolatile memory device of claim 8, wherein the row decoder circuit and the page buffer circuit are further configured to write the dummy data into third memory cells corresponding to the close unit among the first memory cells and then perform a verification read operation on at least a part of the third memory cells, and
    wherein, in response to a first number of on-cells or a second number of off-cells detected as a result of the verification read operation being greater than or equal to a threshold value, the close unit applied to the third memory cells is determined as the final close unit.

12. A storage device comprising:
    a nonvolatile memory device including memory blocks, wherein each of the memory blocks includes pages each including memory cells; and
    a controller configured to transmit an address of a selected memory block to be selected from the memory blocks and a close command to the nonvolatile memory device,
    wherein the nonvolatile memory device is configured to perform a close operation in which dummy data are written in memory cells, into which data are not previously written, from among memory cells of the selected memory block in a close unit, in response to the close command, and
    wherein the close unit is adjusted during the close operation according to a location of the memory cells within the selected memory block.

13. The storage device of claim 12, wherein the memory cells of the selected memory block are connected to word lines,
    wherein, in the close operation, the nonvolatile memory device divides first memory cells connected to first word lines of the word lines in the close unit, to sequentially write the dummy data,
    wherein the first word lines are interposed between a second word line and at least one word line,
    wherein at least a part of second memory cells connected to the second word line stores the data, and
    wherein the close unit increases by a unit of at least one word line until a final close unit is determined.

14. The storage device of claim 13, wherein the nonvolatile memory device is further configured to transmit the final close unit to the controller.

15. The storage device of claim 14, wherein, when a subsequent close operation is performed on the selected memory block after the close operation is performed on the selected memory block, the controller is further configured to transmit the final close unit to the nonvolatile memory device together with a subsequent close command and the address of the selected memory block.

16. The storage device of claim 15, wherein, in response to the subsequent close command, the nonvolatile memory device divides the memory cells in the final close unit to sequentially write the dummy data.

17. The storage device of claim 14, wherein, when a subsequent close operation is performed on the selected memory block after the close operation is performed on the selected memory block and in response to a number of times that an erase operation is performed on the selected memory block after the final close unit of the selected memory block is transmitted from the nonvolatile memory device being greater than or equal to a threshold value, the controller is further configured to transmit a subsequent close command and the address of the selected memory block to the nonvolatile memory device without transmitting the final close unit to the nonvolatile memory device.

18. The storage device of claim 14, wherein, when a subsequent close operation is performed on the selected memory block after the close operation is performed on the selected memory block and in response to a time which passes after the final close unit of the selected memory block is transmitted from the nonvolatile memory device being greater than or equal to a threshold value, the controller is further configured to transmit a subsequent close command and the address of the selected memory block to the nonvolatile memory device without transmitting the final close unit to the nonvolatile memory device.

19. A method of performing a closing operation on a nonvolatile memory device which includes memory blocks, each of the memory blocks including memory cells, the method comprising:
   writing dummy data into memory cells of a first size among first memory cells, into which data are not previously written, from among the memory cells of a memory block selected from the memory blocks; and
   writing the dummy data into memory cells of a second size among the first memory cells,
   wherein the second size is different from the first size, and
   wherein the dummy data is written into memory cells of the first size and the memory cells of the second size in a same close operation.

20. The method of claim 19, further comprising:
   performing a verification read operation on at least a part of the memory cells of the second size; and
   setting the second size to a final close size when a first number of on-cells or a second number of off-cells detected in the performing of the verification read operation is greater than or equal to a threshold value.

* * * * *